US 9,417,297 B2

(12) United States Patent
Holman et al.

(10) Patent No.: US 9,417,297 B2
(45) Date of Patent: Aug. 16, 2016

(54) TUNNELING MAGNETO-RESISTIVE DEVICE WITH SET/RESET AND OFFSET STRAPS

(75) Inventors: Perry Holman, Garland, TX (US); Aravind Padmanabhan, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 778 days.

(21) Appl. No.: 13/398,496

(22) Filed: Feb. 16, 2012

(65) Prior Publication Data

US 2013/0214776 A1 Aug. 22, 2013

(51) Int. Cl.
*G01R 33/02* (2006.01)
*G01R 33/09* (2006.01)

(52) U.S. Cl.
CPC .............. *G01R 33/098* (2013.01); *G01R 33/09* (2013.01)

(58) Field of Classification Search
CPC ............................... G01R 33/098; G01R 33/09
USPC ........................................................ 324/252
See application file for complete search history.

(56) References Cited

U.S. PATENT DOCUMENTS

| 5,351,005 | A * | 9/1994 | Rouse .................... G01R 17/10 324/207.21 |
| 6,252,796 | B1 * | 6/2001 | Lenssen et al. ................ 365/173 |
| 6,445,171 | B2 | 9/2002 | Sandquist et al. |
| 6,456,523 | B1 * | 9/2002 | Tanaka et al. .................. 365/158 |
| 2003/0117254 | A1 * | 6/2003 | Wan et al. .................... 338/32 R |
| 2004/0201378 | A1 * | 10/2004 | Sugano .......................... 324/234 |
| 2009/0212771 | A1 * | 8/2009 | Cummings et al. ........... 324/252 |
| 2011/0025320 | A1 * | 2/2011 | Ohta et al. .................... 324/252 |
| 2012/0013331 | A1 * | 1/2012 | Brunner ........................ 324/244 |
| 2012/0032674 | A1 * | 2/2012 | Rajula et al. .................. 324/253 |
| 2012/0153947 | A1 * | 6/2012 | Ausserlechner .............. 324/252 |
| 2012/0187945 | A1 * | 7/2012 | Ogimoto ....................... 324/244 |

FOREIGN PATENT DOCUMENTS

WO   WO 2011013412 A1 *  2/2011  .............. G01R 15/20

OTHER PUBLICATIONS

"Set/Reset Function for Magnetic Sensors", Honeywell Sensor Products, Application Note AN213, http://www51.honeywell.com/aero/common/documents/myaerospacecatalog-documents/Defense_Brochures-documents/Magnetic_Literature_Application_notes-documents/AN213_Set_Reset_Function_of_Magnetic_Sensors.pdf, (No date listed), 8 pgs.

Caruso, Michael J, et al., "A New Perspective on Magnetic Field Sensing", Sensorspeterborough, 15(12), (1998), 34-47.

* cited by examiner

*Primary Examiner* — Melissa Koval
*Assistant Examiner* — Courtney McDonnough
(74) *Attorney, Agent, or Firm* — Conley Rose, P.C.; Kristin Jordan Harkins

(57) ABSTRACT

A sensing device exhibits a tunneling magneto-resistive (TMR) effect, and changes electrical resistance in response to a magnetic field. A first current carrying conductor is positioned in proximity to the TMR sensing device, such that upon an application of a sufficient current, a magnetic field is generated. The magnetic field is sufficiently strong and properly oriented so as to cause a magnetization of a soft magnetic layer of the TMR sensing device, thereby causing a change of the TMR sensing device from one bi-stable state to another bi-stable state.

20 Claims, 3 Drawing Sheets

TUNNELING MAGNETO-RESISTIVE DEVICE WITH SET/RESET AND OFFSET STRAPS

TECHNICAL FIELD

The present disclosure relates to tunneling magneto-resistive (TMR) devices, and in an embodiment, but not by way of limitation, a TMR device with set/reset and offset straps.

BACKGROUND

Closed loop current sensors are commonly used in many industries. An example of such a sensor is based upon an anisotropic magneto-resistive (AMR) transducer. An AMR sensor is fabricated with a permalloy (NiFe) thin film that creates changes in resistivity with respect to external magnetic fields. These film materials are similar to magnetic recording tapes in that strong magnetic fields can disrupt the magnetic domains of the film particles from a smooth factory orientation to arbitrary directions. Consequently, accuracy and resolution of these sensors suffer until the film magnetic domains are "reset" to recreate a uniform direction. Additionally, in most instances, an AMR sensor has a practical range that is limited to 25 amps due to sensor saturation. However, it would be beneficial for such a sensor to have a range of 100 amps or even 1000 amps.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, electrical, and optical changes may be made without departing from the scope of the present invention. The following description of example embodiments is, therefore, not to be taken in a limited sense, and the scope of the present invention is defined by the appended claims.

As noted above, it is known that anisotropic magneto-resistive (AMR) sensors, which are typically made of 81/19 NiFe (permalloy), exhibit shifts in electrical response. Much of the shift occurs over time, and because of the presence of external magnetic fields. This effect is mainly observed in situations where the external magnetic fields are below a saturating field (below ~50 Gauss). Additionally, changes in the temperature of a permalloy resistor may modify the electrical response. This effect is typically seen as a change in offset (null) of a Wheatstone bridge made of permalloy.

One application where unintended electrical variation is observed is with closed loop electrical current sensors. A closed loop current sensor has an unknown current flowing in a primary coil, and the sensor puts a proportional current in the opposite direction of a secondary coil. The number of turns of the secondary coil is typically much larger than the primary (such as 1000:1). The secondary current is known and is modified until the resultant magnetic field from the primary and secondary current is zero. This is known as null balance. For example, if the ratio is 1000:1, and the sensor has 10 milliamps in the secondary, the primary (unknown) current is –10 Amps.

With such a configuration, the zero point (null point) of the sensing element needs to be accurately and precisely known. Since 0 Gauss is below saturation, various perturbations to the sensing element will create an electrical offset, which equates to an inaccuracy of the sensor. With permalloy, a solution is to have a set/reset strap on the permalloy chip. The set/reset strap is a low resistance (metal, such as aluminum) wire on the chip, such that a shot of current (~1 Amp for 1 microsecond) will create a large enough field at the sensing element to force the orientation of the magnetization into a known configuration. With the set/reset strap current going back and forth, the system may surmise the actual null of the sensing element, thereby correcting the null balance point. The end result is improved accuracy of the overall sensor over all conditions (temperature, part-to-part variation, stray magnetic fields, etc.)

Figure 1A:
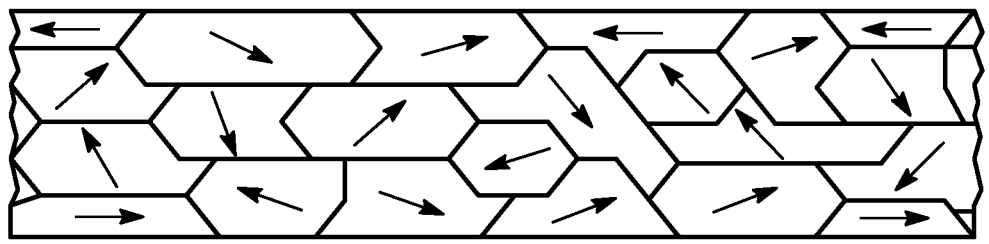
FIGS. 1A, 1B, and 1C illustrate magnetic orientations in a magneto-resistive element.
Figure 1B:
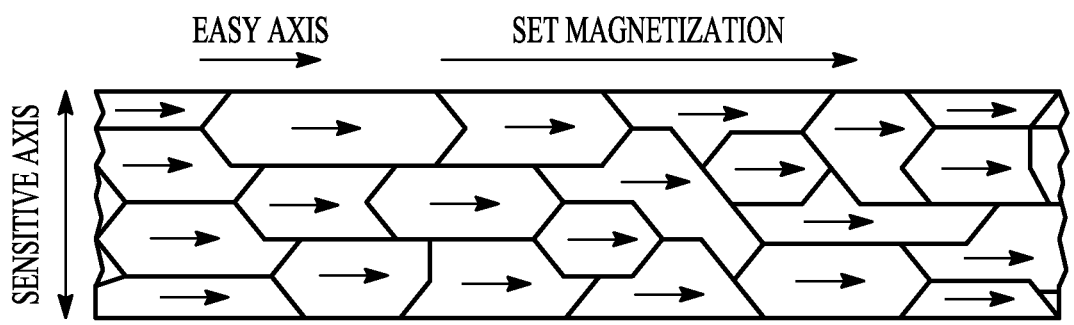
Figure 1C:
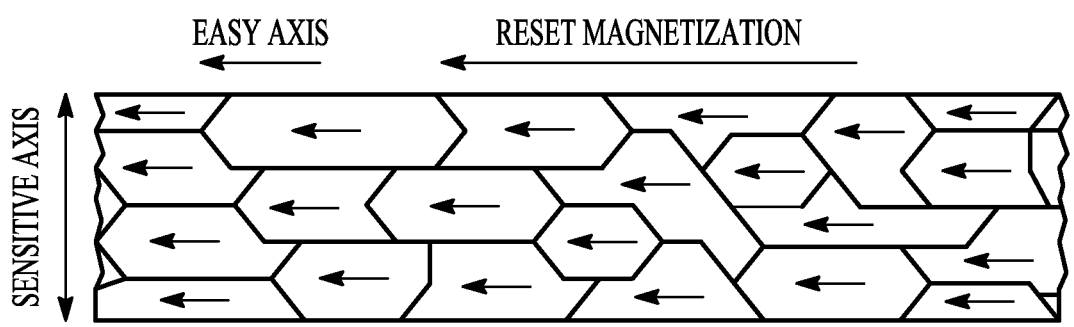

AMR sensors are typically designed in Wheatstone bridge configurations, with four magneto-resistive elements that remain identical electrically when no external magnetic fields are applied. With linear-mode AMR sensors, the externally applied magnetic fields are limited in strength so as to not disrupt the factory set magnetic domains of the permalloy thin-film elements. FIGS. 1A, 1B, and 1C illustrate three examples of magnetic orientation of the film domain structure. The alignment of the magnetic domains is up along the "easy" axis of the material. The "sensitive" axis is perpendicular to the easy axis direction and serves as the driving function of the magneto-resistive characteristic. When an external magnetic field has a vector component in the sensitive axis, the field rotates the magnetic moment thereby creating a change in resistance. If the external magnetic fields are in the operational field range, the magnetic moments will return to their set or reset orientations after the field is removed. Typically a "set" or "reset" field requires about 40 or more gauss to be applied to completely orient the magnetic domains. Exposure to fields under 20 gauss will not disturb the set or reset orientations.

As already alluded to, the reasons to perform a set or reset on an AMR sensor are to recover from a strong external magnetic field that likely has re-magnetized the sensor, to optimize the magnetic domains for most sensitive performance, and to flip the magnetic domains for extraction of bridge offset under changing temperature conditions. High intensity magnetic field sources do not permanently damage the sensor elements, but the magnetic domains will be realigned to the exposed fields rather than the required easy axis directions. The result of this re-magnetization of the sensor elements will be erroneous measurements and indications of "stuck" sensor outputs. However, the use of set and reset pulses will magnetically "restore" the sensor.

Additionally, as the sensor element temperature changes, either due to self-heating or external environments, each element's resistance will change in proportion to the temperature. In the wheatstone bridge configuration with the elements configured as a sensor, the bridge offset voltage and bridge sensitivity will drift with temperature. In sensing devices, the bridge offset voltages must be updated and corrected for best accuracy as the temperature changes. One way to eliminate the bridge offset voltage is to make stable magnetic field measurements of the bridge output voltage in between each set and reset field application. Since the external field components of the bridge output voltage will flip polarity, the set and reset bridge output voltages can be subtracted and the result divided by two to calculate the bridge offset.

To perform the application of set and reset magnetic fields on the AMR sensor elements, a coil co-located on the silicon die with the sensor can be used. This coil can be a planar winding or "strap" of metal wound through the active area of the elements so that an electrical current in the strap creates a corresponding magnetic field into the sensor. Each set/reset strap has a set of electrical characteristics that will be of unique values for each family of sensor products. The important three electrical characteristics for the set/reset strap are the strap resistance, the set/reset current range, and the strap resistance tempco (about 4000 ppm/C).

Tunneling Magneto-Resistive (TMR) devices are known to have improvements over permalloy devices, for example a higher sensitivity around 0 Oe and a larger signal. Also, TMR devices do not saturate to a null configuration. Consequently, using TMR sensing devices, it is possible and practical to develop products over a larger current range. Like AMR devices however, one limitation to any TMR device in a bridge arrangement is offset over temperature. As noted above, with permalloy sensing devices, there are methods to minimize the effects of bridge offset. Specifically, integrated set/reset straps are placed on the sensing chip, and using a current to create a magnetic field, the permalloy sensing devices can minimize the effect of offset over temperature. The current disclosure applies set/reset straps and offset straps to a TMR sensing device to improve offset over temperature, and to improve a current sensor (and other sensor) performance.

In an embodiment, a TMR sensing device is first embodied on a chip, and then, using well-known semiconductor processing techniques, a current carrying trace (such as an aluminum wire) is created on the chip. The trace is typically positioned above the TMR, so that application of a current to the trace will create a magnetic field with enough strength to flip the magnetic domains in the TMR. Flipping the domains back and forth permits a system to determine the offset of the bridge and to compensate for that offset.

TMR materials exhibit several technical advantages over AMR sensing devices. One of these advantages is sensitivity (i.e., electrical resistance change per externally applied unit of magnetic field). In general, sensors should be more sensitive. Therefore, TMR sensing devices can replace AMR sensing devices in many applications, such as closed loop current sensors. TMR sensors will have a change in zero point (null or offset) over different conditions, similar to AMR devices. And while the end electrical effect is the same, TMR devices have much different mechanisms than AMR devices. For example, the inventors have determined that a difference between using a set/reset strap on an AMR sensing device and using a set/reset strap on a TMR sensing device is magnitude. That is, the saturating field for an AMR device is about 50 Gauss. In contrast, the saturating field for a TMR device can be 100 Gauss or higher. Consequently, great care is required to design a TMR sensing device that includes a set/reset strap system. Great care is required, mainly from a temperature rise configuration. Increasing the electrical current applied to the set/rest straps increases the magnetic field applied to the sensing elements. Additionally, the temperature increases rapidly (a squared relationship) with current (and the field is linear with current). Thus the straps have a practical limitation of the amount of current that can be injected. Other design practices (such as multiple loops or turns) increases the field without an increase in temperature.

Figure 2:
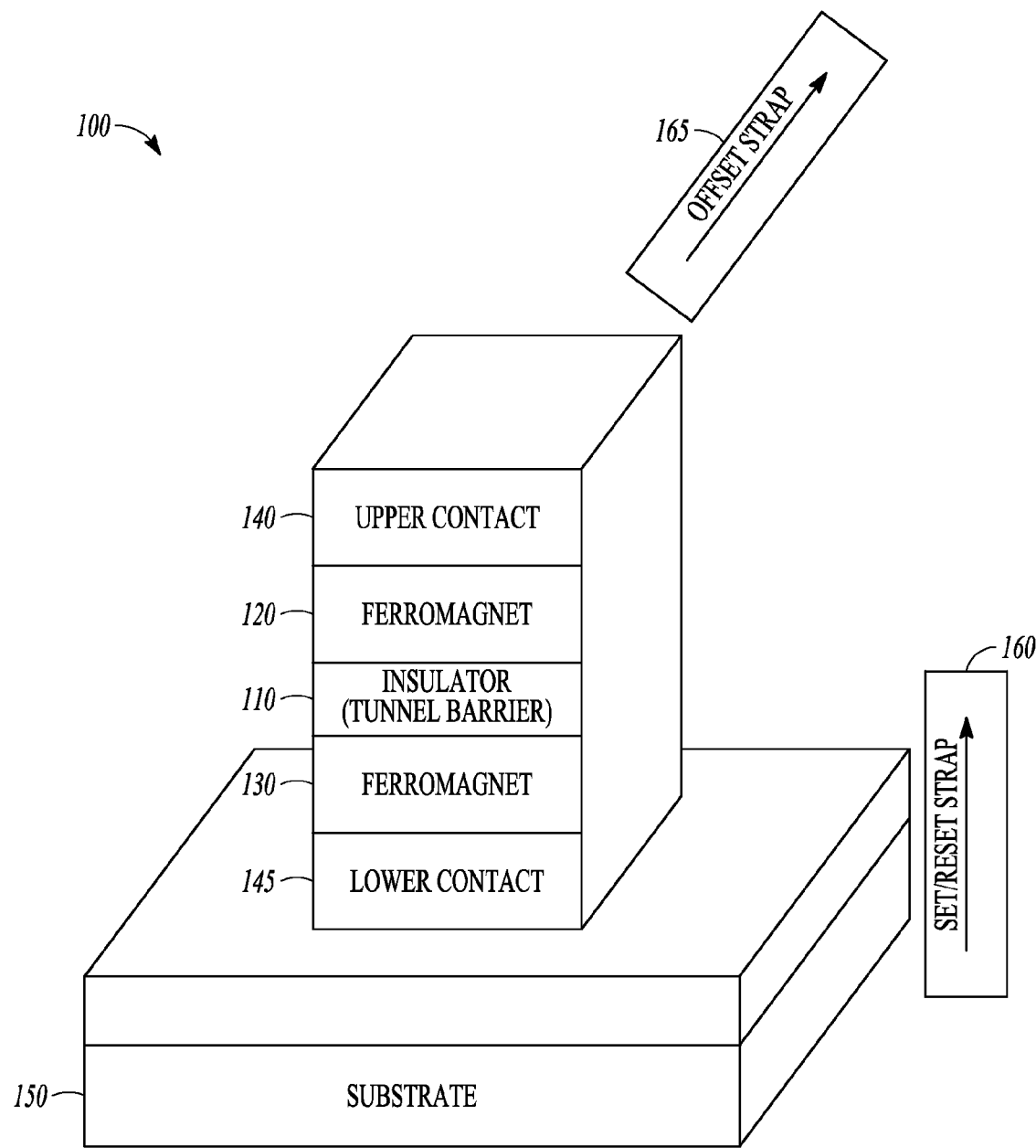
FIG. 2 is a block diagram of a tunneling magneto-resistive (TMR) sensing device.
Figure 3A:
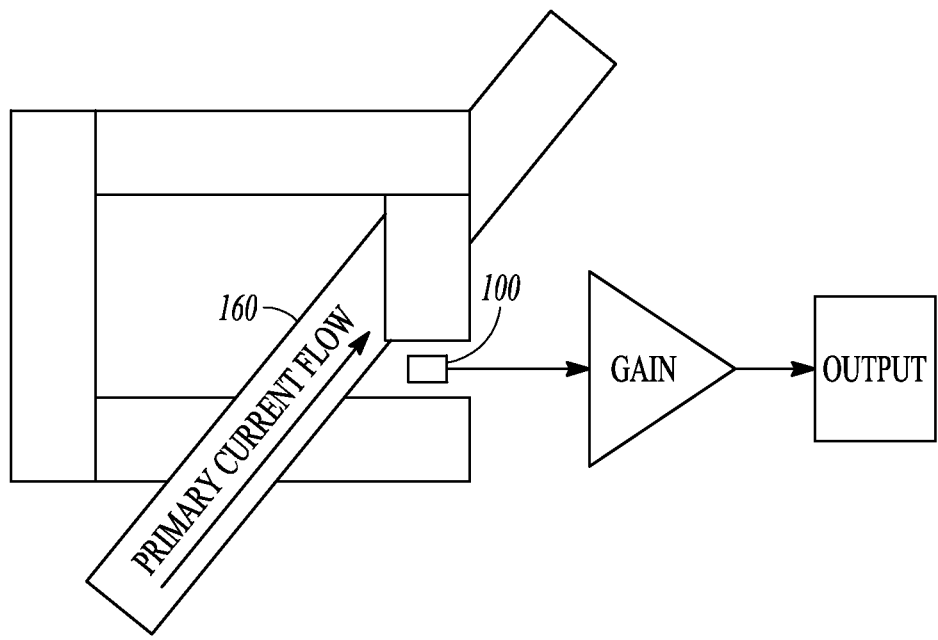
FIGS. 3A and 3B are block diagrams of TMR sensing devices positioned in open loop and closed loop current sensors.
Figure 3B:
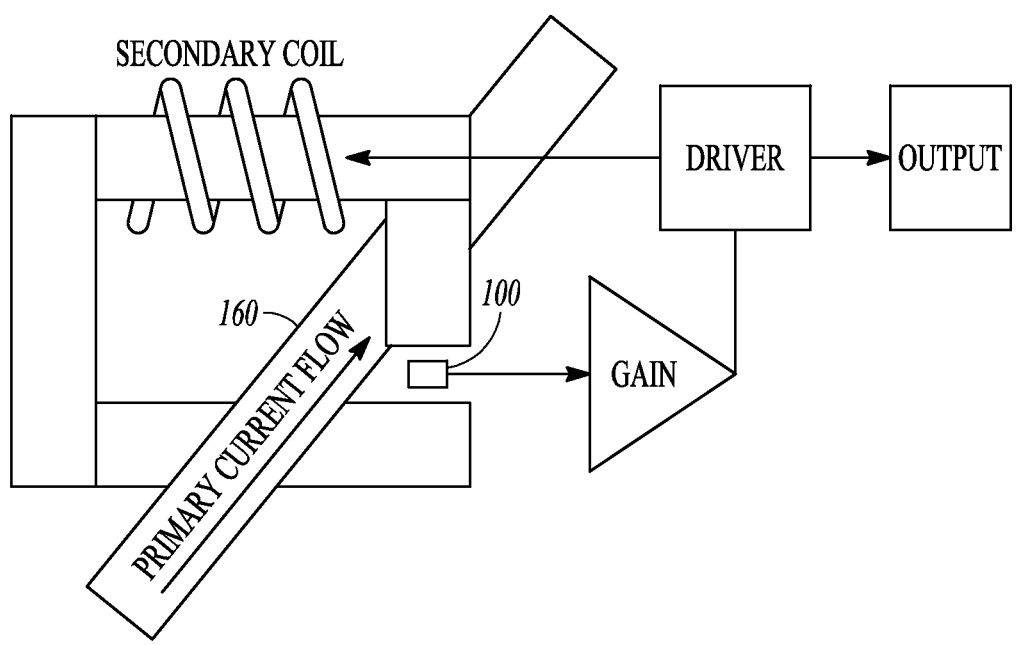

A typical TMR sensing device 100 is illustrated in FIG. 2. The TMR sensing device 100 illustrated in FIG. 2 includes two ferromagnets 120, 130 that are separated by a thin insulator 110. The ferromagnet 120 is a soft magnetic layer, and the ferromagnet 130 is a hard magnetic layer. The soft and hard magnetic layers are normally parallel to one another. The insulating layer 110 is manufactured thinly enough (typically a few nanometers) so that electrons can tunnel from one ferromagnet into the other. The directions of the magnetizations of the two ferromagnetic films 120, 130 can be individually switched by an external magnetic field. If the magnetizations are in a parallel orientation, it is more likely that the electrons will tunnel through the insulating film than if they are in oppositional (anti-parallel) orientation. Consequently, such a ferromagnet-insulator junction can be switched between two states of electrical resistance, one with low resistance and one with very high resistance. The junction therefore becomes a switch that switches magnetically between low resistance and infinite resistance. If no voltage is applied to the junction, electrons tunnel in both directions with equal rates. With a bias voltage however, electrons tunnel preferentially to the positive electrode (either upper contact 140 or lower contact 145). As noted above, using well-known semiconductor manufacturing techniques, the TMR sensing device can be embodied on a substrate 150. A set/reset strap 160 and an offset strap 165 are also illustrated. The placement and use of a TMR device such as illustrated in FIG. 2 in an open loop current sensor and a closed loop current sensor is illustrated in block diagram form in FIGS. 3A and 3B. The insulator 110 makes the resistance of the TMR device 100 rather high (about 1 Mohm). However, when the soft magnetic layer 120 is magnetically rotated by an external magnetic field to be perpendicular (or anti-perpendicular) to the hard magnetic layer, electrons flow across the insulator 110, thereby lowering the resistance of the TMR device 100 by 20-80%.

The set/reset of a TMR device is normally performed many times per second, while the offset is performed at a slower rate of about once per second. To be effective, the set/reset needs to be able to saturate the sensor (about 100 Gauss field).

EXAMPLE EMBODIMENTS

Several embodiments and sub-embodiments have been disclosed above, and it is envisioned that any embodiment can be combined with any other embodiment or sub-embodiment. Specific examples of such combinations are illustrated in the examples below.

Example No. 1 is an apparatus including a sensing device configured to change electrical resistance in response to a magnetic field. The sensing device exhibits a tunneling magneto-resistive effect (TMR). A first current carrying conductor is positioned in proximity to the TMR sensing device, such that upon an application of a sufficient current, a magnetic field is generated. As noted above a sufficient current can be about 1 amp for about 1 microsecond. To be proximate, the current carrying conductor should be about 1 micrometer from the TMR sensing device. The magnetic field is sufficiently strong and properly oriented so as to cause a magnetization of a soft magnetic layer of the TMR sensing device, thereby causing a change of the TMR sensing device from one bi-stable state to another bi-stable state. A sufficiently strong magnetic field is about 50 Gauss or higher. The proper orientation of the magnetic field is a noted above in connection with AMS devices. The bi-stable state change can be from a low resistance state to a high resistance state.

Example No. 2 includes the features of Example No. 1, and optionally includes a sensing device wherein the first current carrying conductor comprises a low resistance metal and is coupled to the TMR sensing device such that a current through the first current carrying conductor causes the change in the TMR sensing device from one bi-stable state to another bi-stable state.

Example No. 3 includes the features of Example Nos. 1-2, and optionally includes a sensing device whereby the change from one bi-stable state to another bi-stable state permits an electrical offset of the TMR sensing device to be determined.

Example No. 4 includes the features of Example Nos. 1-3, and optionally includes a sensing device wherein the soft magnetic layer is planar, and wherein the first current carrying conductor is perpendicular to the soft magnetic layer.

Example No. 5 includes the features of Example Nos. 1-4, and optionally includes a sensing device that includes a second current carrying conductor that is perpendicular to the first current carrying conductor.

Example No. 6 includes the features of Example Nos. 1-5, and optionally includes a sensing device wherein the second current carrying conductor is configured to compensate for an electrical offset of the TMR device.

Example No. 7 includes the features of Example Nos. 1-6, and optionally includes a sensing device wherein the TMR sensing device is a portion of a complete current sensor.

Example No. 8 includes the features of Example Nos. 1-7, and optionally includes a sensing device wherein the TMR sensing device is a portion of a complete closed-loop current sensor.

Example No. 9 includes the features of Example Nos. 1-8, and optionally includes a sensing device wherein the change from one bi-stable state to another bi-stable state comprises a change in a resistance of the TMR sensing device.

Example No. 10 is a tunneling magneto-resistive (TMR) sensing device comprising one or more components configured to change electrical resistance in response to a magnetic field; and a first current carrying conductor positioned in proximity to the TMR sensing device, such that upon an application of a sufficient current, a magnetic field is generated, wherein the magnetic field is sufficiently strong and properly oriented so as to cause a magnetization of a soft magnetic layer of the TMR sensing device, thereby causing a change of the TMR sensing device from one bi-stable state to another bi-stable state.

Example No. 11 includes the features of Example No. 10, and optionally includes a TMR sensing device wherein the first current carrying conductor comprises a low resistance metal and is coupled to the TMR sensing device such that a current through the first current carrying conductor causes the change in the TMR sensing device from one bi-stable state to another bi-stable state.

Example No. 12 includes the features of Example Nos. 10-11, and optionally includes a TMR sensing device whereby the change from one bi-stable state to another bi-stable state permits an electrical offset of the TMR sensing device to be determined.

Example No. 13 includes the features of Example Nos. 10-12, and optionally includes a TMR sensing device wherein the soft magnetic layer is planar, and wherein the first current carrying conductor is perpendicular to the soft magnetic layer.

Example No. 14 includes the features of Example Nos. 10-13, and optionally includes a TMR sensing device comprising a second current carrying conductor that is perpendicular to the first current carrying conductor.

Example No. 15 includes the features of Example Nos. 10-14, and optionally includes a TMR sensing device wherein the second current carrying conductor is configured to compensate for an electrical offset of the TMR device.

Example No. 16 includes the features of Example Nos. 10-15, and optionally includes a TMR sensing device wherein the TMR sensing device is a portion of a complete current sensor.

Example No. 17 includes the features of Example Nos. 10-16, and optionally includes a TMR sensing device wherein the TMR sensing device is a portion of a complete closed-loop current sensor.

Example No. 18 includes the features of Example Nos. 10-17, and optionally includes a TMR sensing device wherein the change from one bi-stable state to another bi-stable state comprises a change in a resistance of the TMR sensing device.

Example No. 19 is an apparatus comprising a sensing device configured to change electrical resistance in response to a magnetic field, wherein the sensing device exhibits a tunneling magneto-resistive effect (TMR); and a first current carrying conductor positioned in proximity to the TMR sensing device, such that upon an application of a sufficient current, a magnetic field is generated, wherein the magnetic field is sufficiently strong and properly oriented so as to cause a magnetization of a soft magnetic layer of the TMR sensing device, thereby causing a change of the TMR sensing device from one bi-stable state to another bi-stable state; whereby the change from one bi-stable state to another bi-stable state permits an electrical offset of the TMR sensing device to be determined.

Example No. 20 includes the features of Example No. 19, and optionally includes a TMR sensing device wherein the TMR sensing device is a portion of a complete current sensor.

It should be understood that there exist implementations of other variations and modifications of the invention and its various aspects, as may be readily apparent, for example, to those of ordinary skill in the art, and that the invention is not limited by specific embodiments described herein. Features and embodiments described above may be combined with each other in different combinations. It is therefore contemplated to cover any and all modifications, variations, combinations or equivalents that fall within the scope of the present invention.

The Abstract is provided to comply with 37 C.F.R. §1.72(b) and will allow the reader to quickly ascertain the nature and gist of the technical disclosure. It is submitted with the understanding that it will not be used to interpret or limit the scope or meaning of the claims.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single disclosed embodiment. Thus the following claims are hereby incorporated into the Description of the Embodiments, with each claim standing on its own as a separate example embodiment.

The invention claimed is:

1. An apparatus comprising:
a sensing device configured to change electrical resistance in response to a magnetic field, wherein the sensing device exhibits a tunneling magneto-resistive effect (TMR); and
a first current carrying conductor positioned in proximity to the TMR sensing device, wherein the first current carrying conductor is configured to generate the magnetic field upon an application of a sufficient current, wherein the first current carrying conductor is configured such that the generated magnetic field is sufficiently strong and properly oriented so as to cause a magnetization of a soft magnetic layer of the TMR sensing device, and to cause a change of the TMR sensing device from one bi-stable state to another bi-stable state; and control circuitry electrically coupled to the sensing device and the first current carrying conductor, wherein the control circuitry is configured to apply the sufficient current to the first current carrying conductor, to force the orientation of the magnetization into a known configuration, and to determine an actual null of the apparatus, and wherein the control circuitry is configured to correct a null balance point of the apparatus.

2. The apparatus of claim 1, wherein the first current carrying conductor comprises a low resistance metal and is coupled to the TMR sensing device, wherein the first current carrying conductor is configured such that a current through the first current carrying conductor causes the change in the TMR sensing device from the one bi-stable state to the other bi-stable state.

3. The apparatus of claim 2, wherein the control circuitry is further configured to determine an electrical offset of the TMR sensing device based on the change from the one bi-stable state to the other bi-stable state.

4. The apparatus of claim 1, wherein the soft magnetic layer is planar, and wherein the first current carrying conductor is perpendicular to the soft magnetic layer.

5. The apparatus of claim 4, further comprising a second current carrying conductor positioned perpendicular to the first current carrying conductor.

6. The apparatus of claim 5, wherein the second current carrying conductor is configured to compensate for an electrical offset of the TMR device.

7. The apparatus of claim 1, wherein the TMR sensing device is a portion of a complete current sensor.

8. The apparatus of claim 1, wherein the TMR sensing device is a portion of a complete closed-loop current sensor.

9. The apparatus of claim 1, wherein the change from the one bi-stable state to the other bi-stable state comprises a change in a resistance of the TMR sensing device.

10. A tunneling magneto-resistive (TMR) sensing device comprising:
    one or more components configured to change electrical resistance in response to a magnetic field; and
    a first current carrying conductor positioned in proximity to the TMR sensing device and coupled to control circuitry, wherein the first current carrying conductor is configured, upon an application of a first sufficient current, to generate the magnetic field that is sufficiently strong and properly oriented to cause a magnetization of a soft magnetic layer of the TMR sensing device, wherein the one or more components are configured to change from one bi-stable state to another bi-stable state in response to the magnetization of the soft magnetic layer of the TMR sensing device, and wherein the first current carrying conductor is configured, upon an application of a second sufficient current, to generate a second magnetic field that is sufficiently strong and properly oriented to cause a flipping of the one bi-stable state and the other bi-stable state, wherein the control circuitry is configured to determine an offset of the TMR sensing device and allow for compensation of the offset based on the flipping of the one bi-stable state and the other bi-stable state.

11. The TMR sensing device of claim 10, wherein the first current carrying conductor comprises a low resistance metal and is coupled to the TMR sensing device such that a current through the first current carrying conductor causes the change in the TMR sensing device from the one bi-stable state to the other bi-stable state.

12. The TMR sensing device of claim 11, wherein the control circuitry is configured to determine the offset based on the change from the one bi-stable state to the other bi-stable state and the flipping of the one bi-stable state and the other bi-stable state.

13. The TMR sensing device of claim 10, wherein the soft magnetic layer is planar, and wherein the first current carrying conductor is perpendicular to the soft magnetic layer.

14. The TMR sensing device of claim. 13, comprising a second current carrying conductor that is perpendicular to the first current carrying conductor.

15. The TMR sensing device of claim 14, wherein the second current carrying conductor is configured to compensate for an electrical offset of the TMR device.

16. The TMR sensing device of claim 10, wherein the TMR sensing device is a portion of a complete current sensor.

17. The TMR sensing device of claim 10, wherein the TMR sensing device is a portion of a complete closed-loop current sensor.

18. The TMR sensing device of claim 10, wherein the change from the one bi-stable state to the other bi-stable state comprises a change in a resistance of the TMR sensing device.

19. An apparatus comprising:
    a sensing device configured to change electrical resistance in response to a magnetic field, wherein the sensing device exhibits a tunneling magneto-resistive effect (TMR);
    a first current carrying conductor non-perpendicularly positioned in proximity to the TMR sensing device, wherein the first current carrying conductor is coupled to control circuitry, wherein the first current carrying conductor is configured, upon an application of a first sufficient current, to generate a first magnetic field that is sufficiently strong and properly oriented so as to cause a magnetization of a soft magnetic layer of the TMR sensing device, wherein the TMR sensing device is configured to undergo a first change from one bi-stable state to another bi-stable state in response to the magnetization of the soft magnetic layer of the TMR sensing device, wherein the control circuitry is configured to determine an electrical offset of the TMR sensing device based on the first change from the one bi-stable state to the other bi-stable state;
    a second current carrying conductor perpendicularly positioned in proximity to the TMR sensing device, wherein the second current carrying conductor is coupled to the control circuitry, wherein the second current carrying conductor is configured, upon an application of a second sufficient current, to generate a second magnetic field that is sufficiently strong and properly oriented so as to cause a second magnetization of the soft magnetic layer of the TMR sensing device, wherein the TMR sensing device is configured to undergo a second change from the one bi-stable state to the other bi-stable state in response to the second magnetization of the soft magnetic layer of the TMR sensing device, wherein the TMR sensing device is configured to reset in response to the second change from the one bi-stable state to the other bi-stable state.

20. The apparatus of claim 19, wherein the TMR sensing device is a portion of a complete current sensor.

\* \* \* \* \*